(12) United States Patent
Stillman et al.

(10) Patent No.: US 8,471,577 B2
(45) Date of Patent: Jun. 25, 2013

(54) LATERAL COUPLING ENABLED TOPSIDE ONLY DUAL-SIDE TESTING OF TSV DIE ATTACHED TO PACKAGE SUBSTRATE

(75) Inventors: Daniel Joseph Stillman, Garland, TX (US); James L. Oborny, Sachse, TX (US); William John Antheunisse, Rowlett, TX (US); Norman J. Armendariz, Plano, TX (US); Ramyanshu Datta, San Jose, CA (US); Margaret Simmons-Matthews, Richardson, TX (US); Jeff West, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 469 days.

(21) Appl. No.: 12/814,140

(22) Filed: Jun. 11, 2010

(65) Prior Publication Data

US 2011/0304349 A1    Dec. 15, 2011

(51) Int. Cl.
*G01R 31/20* (2006.01)
(52) U.S. Cl.
USPC .................................................... 324/754.01

(58) Field of Classification Search
USPC ................. 324/762.01–762.1, 754.01–754.3, 324/755.01–755.1; 257/48; 438/14–18
See application file for complete search history.

(56) References Cited

U.S. PATENT DOCUMENTS

| | | | |
|---|---|---|---|
| 5,986,459 A * | 11/1999 | Fukaya et al. | 324/756.02 |
| 7,632,753 B1 | 12/2009 | Rusli et al. | |
| 8,183,087 B2 * | 5/2012 | Lin et al. | 438/106 |

* cited by examiner

*Primary Examiner* — Tung X Nguyen
(74) *Attorney, Agent, or Firm* — Steven A. Shaw; W. James Brady; Frederick J. Telecky, Jr.

(57) ABSTRACT

A method of topside only dual-side testing of an electronic assembly includes providing a singulated through substrate via (TSV) die flip chip attached to a die support including a package substrate. The TSVs on the TSV die extend from its frontside to contactable TSV tips on its bottomside. The TSVs on the frontside of the TSV die are coupled to embedded topside substrate pads on a top surface of the ML substrate. The die support includes lateral coupling paths between at least a portion of the embedded topside substrate pads and lateral topside pads on a topside surface of the die support lateral to the die area. The contactable TSV tips are contacted with probes to provide a first topside connection to the TSVs, and the lateral topside pads are contacted with probes to provide a second topside connection. Dual-side testing across the electronic assembly is performed using the first and second topside connections.

23 Claims, 7 Drawing Sheets

LATERAL COUPLING ENABLED TOPSIDE ONLY DUAL-SIDE TESTING OF TSV DIE ATTACHED TO PACKAGE SUBSTRATE

FIELD

Disclosed embodiments relate to integrated circuits (ICs), and more particularly to testing stacked electronic assemblies.

BACKGROUND

PoP is an integrated circuit (IC) packaging technique that allows vertically stacking of IC packages, such as a discrete logic ball grid array (BGA) package and a memory BGA package. Two or more packages are installed on top of one another, i.e. vertically stacked, with a standard interface to route signals between them. This allows higher density, for example for mobile telephone/PDA market applications.

Through substrate via (TSV)-containing IC die such as microprocessors TSV die in a PoP flow are generally not yet in production. However, the assembly flow for a conventional PoP sequence for a wafer having a plurality of TSV die (a "TSV wafer") can be expected to be as follows:
1. Wafer probe ("multiprobe") the respective die on a thick TSV wafer (e.g., 600 to 800 µm thick) having embedded TSVs to identify good die on the basis of electrical tests. Electronic Inking where the die are tracked on stored wafer maps may be used for subsequent identification of "bad" die.
2. Singulate the TSV wafer to provide a plurality of singulated "good" TSV die.
3. Die attach the good TSV die identified at wafer probe active circuit side down to a multi-layer (ML) package substrate that includes BGA pads on its bottom side that is typically attached to a carrier (typically a silicon or glass carrier) to form a PoP precursor. The carrier provides rigidity.
4. Expose the embedded TSVs by thinning the bottom side of the TSV die (e.g. to about 30 to 100 µm) to form a thinned PoP precursor having contactable TSV tips. The active circuit side (i.e. frontside) of the TSV die is not electrically accessible via the package substrate due to the presence of the carrier.
5. Ship the thinned PoP precursor to a customer.
6. The customer (or its contactor) then (i) adds one or more die, such as a memory die, on top of the TSV die to make contact with the TSV tips or contact pads coupled to the TSV tips to form the PoP, and then (ii) the customer (or its contactor) removes the carrier and adds a BGA on the BGA pads of the package substrate.

Steps 3 and 4 in the above-described flow can result in electrical problems including TSV formation problems (e.g., missing TSVs), TSV contact problems (e.g., high resistance contacts) or shorts (e.g., TSV shorts to ground) that can only be detected after assembly of the top die to complete the PoP because as noted above the carrier while present blocks access to one side of the TSV die. The package substrate can also be the source of certain problems. Probing after die attach of the TSV die can be omitted. However, this will result in shipping some fraction of bad thinned PoP precursors onto step 6 described above for customer's assembly (e.g., where costly pre-packaged memory stacks may be added), that due electrical problems such as those described above that can result in failures at final PoP testing. There are no known practical solutions. What is needed is a method to test thinned PoP precursors to allow testing of the TSV die and one or more test parameters (e.g., including test parameters associated with the die attach process) of the TSV die from the same side (e.g., the topside), whether simply being more convenient or being necessary due to the presence of a carrier.

SUMMARY

Disclosed embodiments describe methods of topside only dual-side testing across an electronic assembly that permits testing the TSVs and parameters associated with the die attach process. A singulated TSV die is provided flip chip attached to a die support comprising a ML package substrate, wherein the TSV die has a die area and a plurality of TSVs that extend from a frontside of the TSV die (e.g., coupled to a back end of the line (BEOL) metal layer) to contactable TSV tips on a bottomside of the TSV die. The TSVs on the frontside of the TSV die are coupled to embedded topside substrate pads on a top surface of the ML package substrate (i.e., below the die area). As used herein, the term "contactable TSV tips" includes protruding, flush or recessed tips. The TSV tips can be contacted directly such when the tips are protruding TSV tips (e.g., protruding copper tips with a Pd, Au or solder outer tip surface) or indirectly contactable TSV tips, such when the tips are flush or recessed and there are pads coupled to the tips, whether the pads are directly over the TSV tips or lateral to the TSV tips using a redirect layer (RDL) for coupling.

The die support includes lateral coupling paths (e.g., metal traces) between at least a portion of the embedded topside substrate pads (which are coupled to TSVs on the frontside of the TSV die) and lateral topside pads positioned on a topside surface of the die support positioned lateral to the die area. The contactable TSV tips are topside contacted with a first plurality of probes to provide a first topside connection to the contactable TSV tips on the bottomside of the TSV die. The lateral pads are topside contacted with a second plurality of probes to provide a second topside connection that couples to the TSVs on the frontside of the TSV die through the embedded topside substrate pads. The electronic assembly is dual-side tested using the first and second topside connections to obtain at least one test parameter. The lateral topside pads can be later embedded in mold compound at final assembly.

In one embodiment, the lateral coupling paths are provided between embedded topside substrate pads and lateral topside substrate pads beyond the die area by routing through the package substrate. This embodiment can include a substrate carrier, which generally provides only a support function. In another embodiment, the die support is a die support stack comprising the ML package substrate secured to a metal embedded substrate carrier. In this embodiment the lateral coupling paths are provided between at least as portion of the embedded topside substrate pads and lateral topside pads on the top surface of a metal embedded substrate carrier by vertically traversing the package substrate to traces in the metal embedded carrier. Substrate carrier embodiments solve the problems resulting from the inability to test the electronic stack after die attach during PoP assembly due to the presence of the substrate carrier under the ML package substrate.

DETAILED DESCRIPTION

Figure 1:
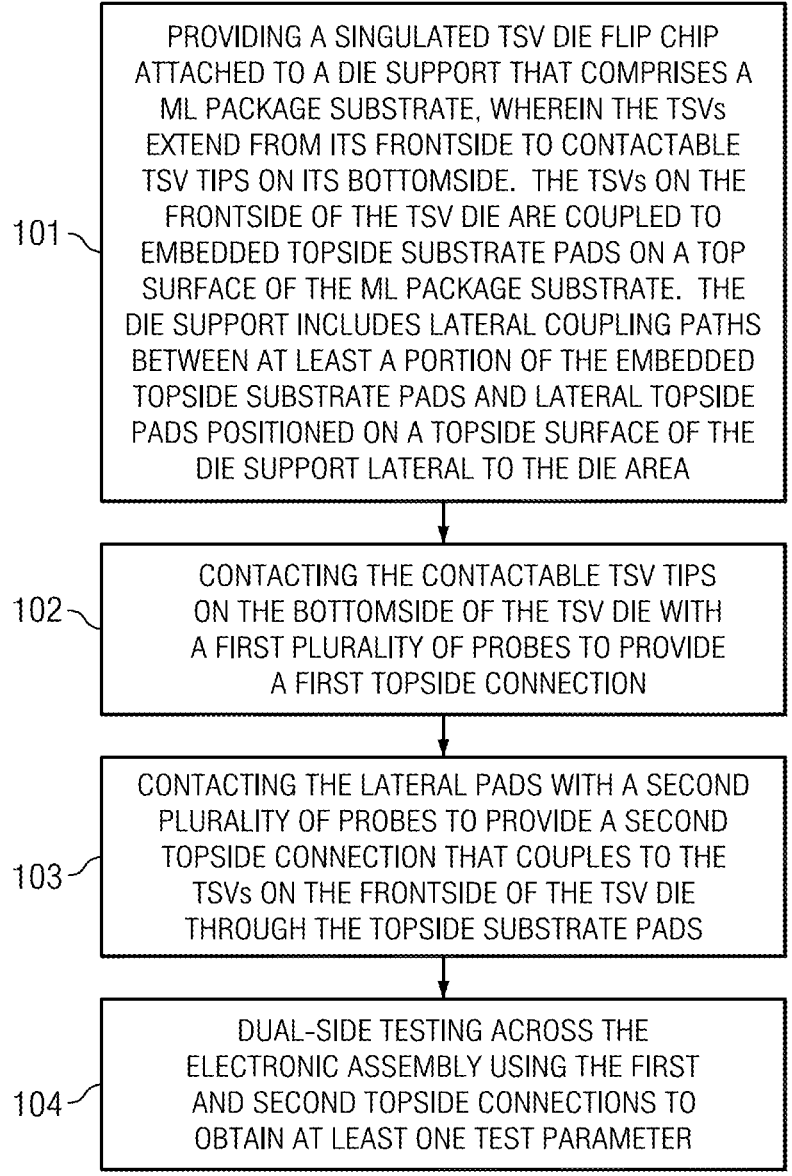
FIG. 1 is a flow chart that shows steps in an exemplary method for topside only dual-side testing of an electronic assembly comprising a singulated TSV die flip chip attached to a ML package substrate, according to an embodiment of the invention.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is a flow chart that shows steps in an exemplary method 100 for topside only dual-side testing of an electronic assembly comprising a singulated TSV die flip chip attached to a ML package substrate, according to an embodiment of the invention. Step 101 comprises providing a singulated TSV die flip chip attached to a die support that comprises a ML package substrate, wherein the TSV die has a die area and a plurality of TSVs that extend from its frontside (generally coupled to a BEOL metal layer (e.g., M1, M2, etc.) to contactable TSV tips on its bottomside. In one embodiment the die support comprises a die support stack comprising the ML package substrate secured to a substrate carrier.

As described above, "contactable TSV tips" includes either directly contactable TSV tips or indirectly contactable tips, such as when pads are coupled to the TSV tips. The TSVs on the frontside of the TSV die are coupled to embedded topside substrate pads on a top surface of the ML package substrate that are below the die area. The die support includes lateral coupling paths between at least a portion of the embedded topside substrate pads and lateral topside pads positioned on a topside surface of the die support lateral to the die area.

The ML package substrate can comprise an organic substrate or a ceramic substrate. The ML package substrate can comprises a singulated substrate or a substrate panel comprising a plurality of physically connected ML package substrates.

Step 102 comprises contacting the contactable TSV tips on the bottomside of the TSV die with a first plurality of probes to provide a first topside connection. The first plurality of probes can comprise vertical probes. Step 103 comprises contacting the lateral topside pads with a second plurality of probes to provide a second topside connection that couples to the TSVs on the frontside of the TSV die through the lateral topside pads. The second plurality of probes can comprise spring loaded pins, such as Pogo pins, which as known in the art slender cylinders containing two sharp, spring-loaded pins. A hybrid probe card can be used to simultaneously contact the first and second topside connections.

Step 104 comprises dual-side testing across the electronic assembly using the first and second topside connections to obtain at least one test parameter. The testing can be automatic testing, such as using a hybrid probe card interfaced to an automatic test system. The testing can comprise (again) multi-probing the singulated TSV die and/or continuity testing of the plurality of TSVs to the package substrate and shorts between the plurality of TSVs and ground.

Figure 2A:
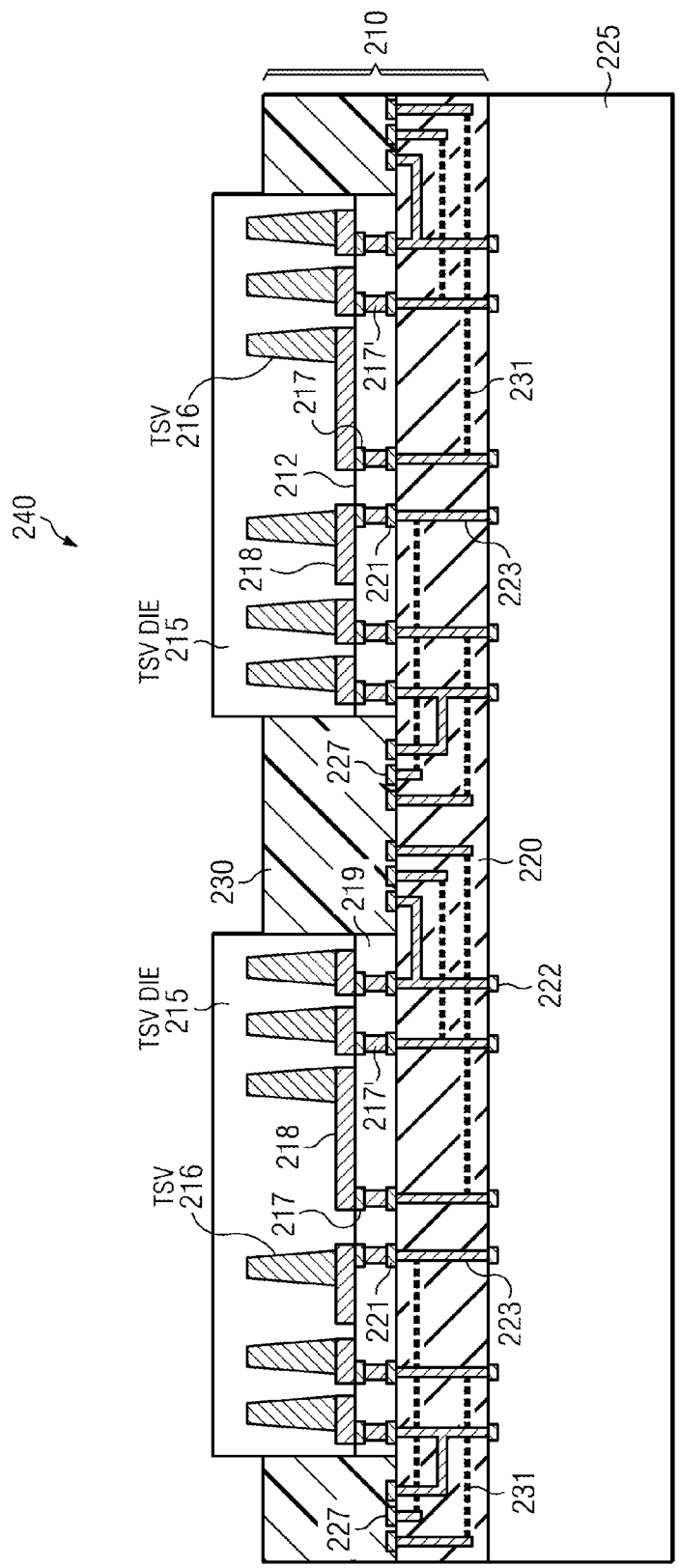
FIGS. 2A-C are successive cross sectional depictions for an assembly flow portion embodiment where coupling paths are provided between embedded topside substrate pads under the die area and lateral topside substrate pads beyond the die area by routing through the package substrate, according to a disclosed embodiment.
Figure 2B:
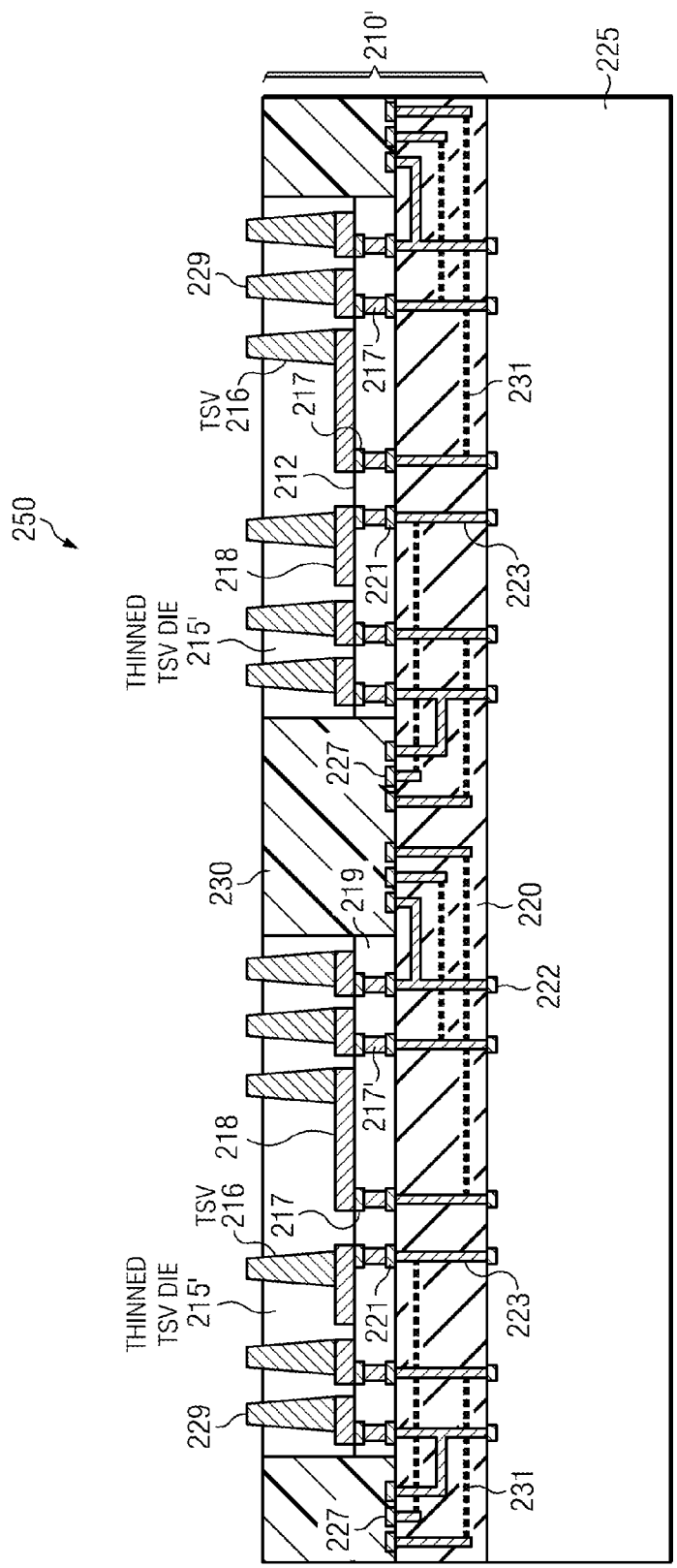
Figure 2C:
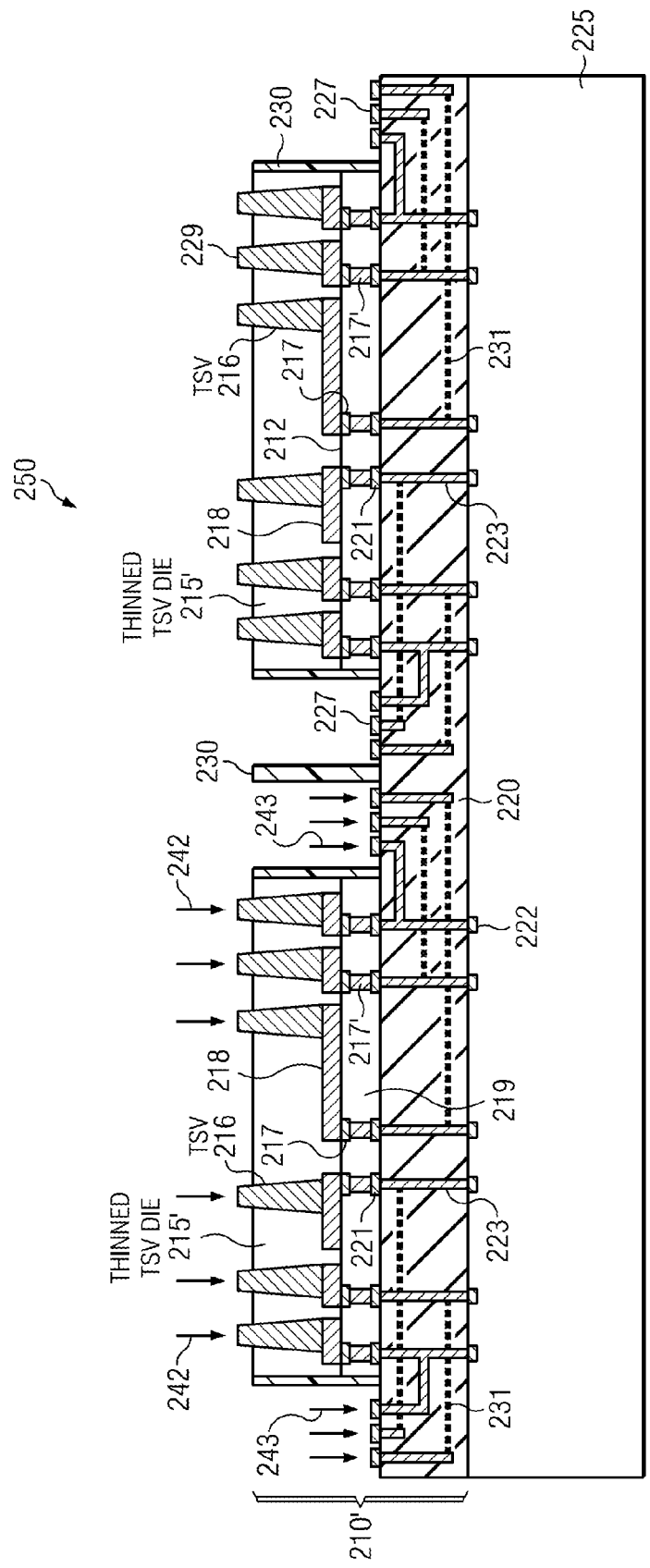

FIGS. 2A-C are successive cross sectional depictions for an assembly flow portion embodiment where lateral coupling paths are provided between at least a portion of the embedded topside substrate pads and lateral topside substrate pads beyond the die area by routing (e.g. with traces) through the package substrate, according to a disclosed embodiment. FIG. 2A shows a cross sectional depiction of a carrier supported electronic assembly 240 comprising an electronic assembly 210 following the flip chip die attach of a singulated TSV die 215 comprising a frontside 212 to a ML package substrate 220 that is disposed on a substrate carrier 225. The TSV die 215 is a thick die (typically 600 to 800 μm thick, or more) and includes a plurality of embedded TSVs 216. The frontside of the TSVs which are face-down as shown are coupled to pillar pads 217 and pillars 217' (e.g., copper pillars) via BEOL metal layers 218, where the pillars 217' are coupled to topside substrate pads 221 of substrate. The pillars 217' can be replaced by studs (e.g., gold studs) or bumps.

The substrate 220 also includes BGA substrate pads 222 and vertical paths 223 that couple the embedded topside substrate pads 221 to the BGA substrate pads 222. Although shown as direct vertical paths 223, the vertical paths 223 can be indirect paths as well provided coupling is provided between the topside substrate pads 221 and the BGA substrate pads 222. The substrate 220 also includes lateral coupling paths 231 (shown as dashed lines) between at least a portion of the embedded topside substrate pads 221 and lateral topside pads 227 positioned on a topside surface of the substrate 220 lateral to the die area of TSV die 215. Not all embedded topside substrate pads 221 are necessarily routed to lateral topside pads 227 as shown in FIG. 2A. Underfill 219, such as organic underfill, is lateral to the pillars 217' for filling the volume between the TSV die 215 and the package substrate 220 between the pillar joints to package substrate 220. Mold compound 230 is shown between the TSV die 215 for adding rigidity.

FIG. 2B shows a cross sectional depiction of a carrier supported electronic assembly 250 following TSV exposure comprising a thinned electronic assembly 210' that includes thinned TSV die 215' having protruding TSV tips 229 that are directly contactable. The protruding TSV tips 229 which typically protrude a distance of 3 to 15 µm from the bottom-side of the thinned TSV die 215' provide the structure for bonding at least one die (e.g., a memory die) onto the thinned electronic assembly 210'. However, as noted above, the contactable TSV tips can be flush (non-protruding) or recessed (i.e., nearly flush), and coupled to by contacting pads that are over the TSV tips or laterally positioned pads (e.g. by an RDL) which are contacted during testing.

TSV exposure to form protruding TSV tips 229, or more generally contactable TSV tips, can comprise backgrinding chemical mechanical polishing (CMP) and/or chemical etch. The thickness of TSV die 215' is generally <200 µm after TSV exposure, generally being 40 to 100 µm thick.

FIG. 2C shows a cross sectional depiction of the carrier supported electronic assembly 210' after exposing lateral topside pads 227 while being topside only dual-side tested. The lateral topside pads 227 can be exposed using a process comprising through mold via (TMV) formation. The TSV process cans form one large via per electronic assembly that exposes a plurality of lateral topside pads, or separate TMVs having single or small groups of lateral pads 227 can be formed. The mold compound is more generally a polymer-based material that could be an adhesive or mold compound, or other material that is laser ablatable. There may or may not be filler within the mold compound.

The TSV tips 229 on the bottomside of the TSV die 215' are contacted with first plurality of probes 242 to provide a first topside connection. As described above, in one embodiment a hybrid probe card can be used having a first plurality of probes (e.g., vertical probes) 242 for probing the TSV tips 229 and a second plurality of probes 243 for contacting the lateral top pads 227 to provide a second topside connection that couples to the TSVs 216 on the frontside of the TSV die through the embedded topside substrate pads 221. The second plurality of probes 243 can comprise spring loaded pins, such as Pogo pins. The lateral topside pads 227 if remaining after singulation can be later embedded in mold compound at final assembly.

The testing of the thinned electronic assembly 210' allows testing of the thinned TSV die 215' while attached to the package substrate 220 to determine one or more test parameters including parameters associated with the die attach process while the substrate carrier 225 is present. Defective thinned electronic assemblies 210' can be identified and scrapped so that the outgoing quality is substantially improved as compared to the conventional no-test at this intermediate assembly point.

Figure 2D:
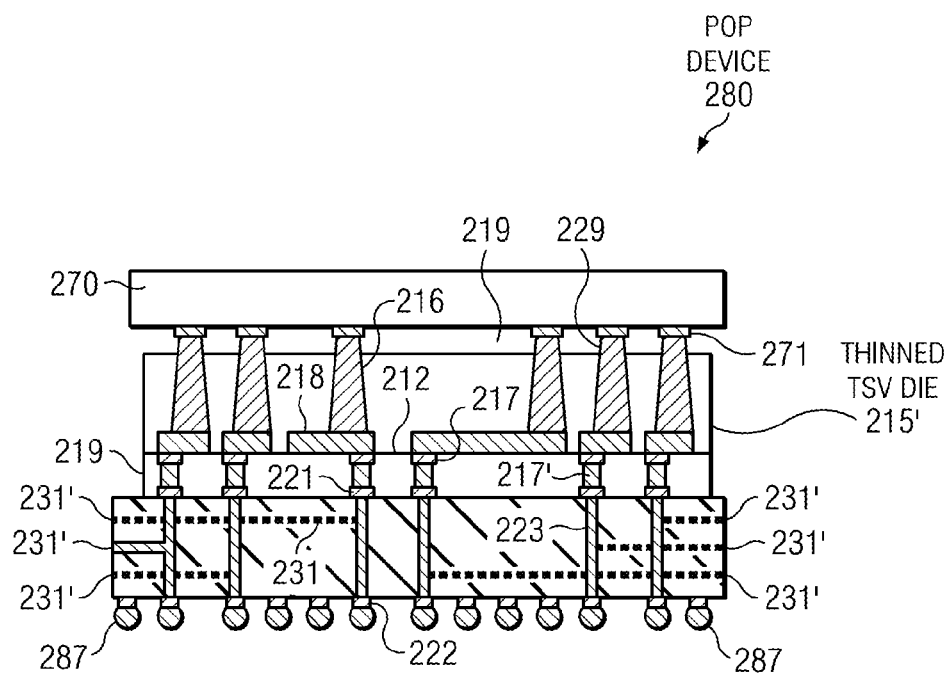
FIG. 2D is a cross sectional depiction of a singulated PoP device comprising a top IC die having pads bonded to TSV tips of the TSV die of the thinned electronic assembly shown in FIG. 2C, according to a disclosed embodiment.

FIG. 2D is a cross sectional depiction of a singulated PoP device 280 comprising a top IC die 270 (e.g., memory die) having pads 271 bonded to protruding TSV tips 229 of TSV die 215' (e.g. processor die) of thinned electronic assembly 210' shown in FIG. 2C. Because the singulation process has severed at least some of the lateral coupling paths 231 (shown as dashed lines) that had coupled to lateral topside pads 227 being just beyond the die area of TSV die 215', the edge of the ML substrate 220 as shown in FIG. 2D evidences coupling path ends 231' along a sidewall of the ML package substrate. BGA balls 287 are shown on BGA substrate pads 222.

Figure 2E:
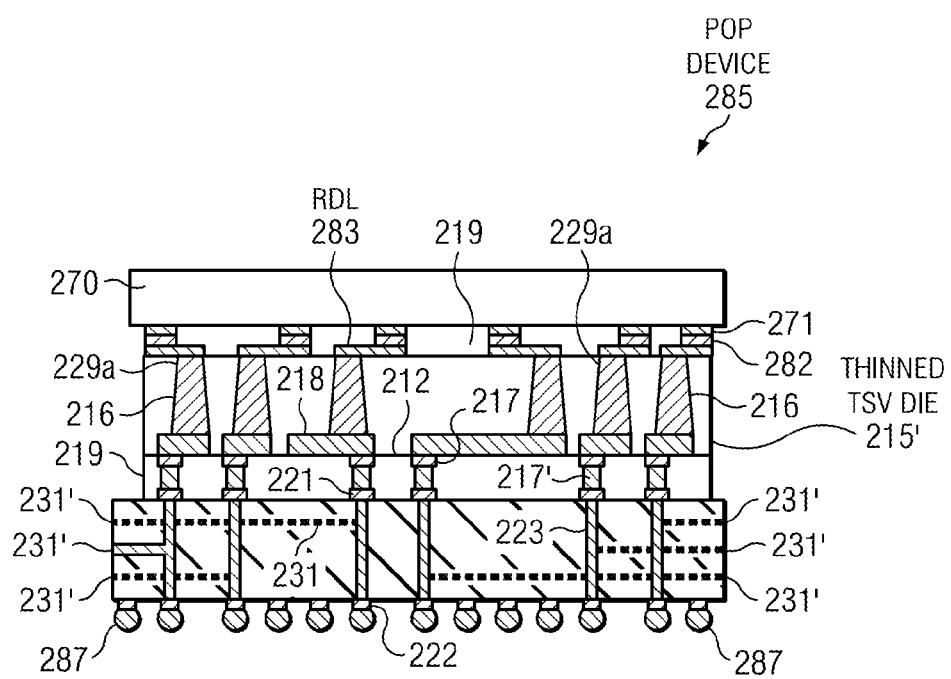
FIG. 2E is a cross sectional depiction of a singulated PoP device comprising a top IC die having pads bonded to pads on the TSV die that are lateral to and coupled to flush or slightly recessed TSV tips of the TSV die of a thinned electronic assembly, according to a disclosed embodiment.

FIG. 2E is a cross sectional depiction of a singulated PoP device 285 comprising a top IC die having pads 271 bonded to pads 282 on the TSV die that are lateral to and coupled to flush or slightly recessed TSV tips 229(a) of the TSV die of a thinned electronic assembly, according to a disclosed embodiment. The lateral coupling is shown provided by a RDL 283.

Figure 2F:
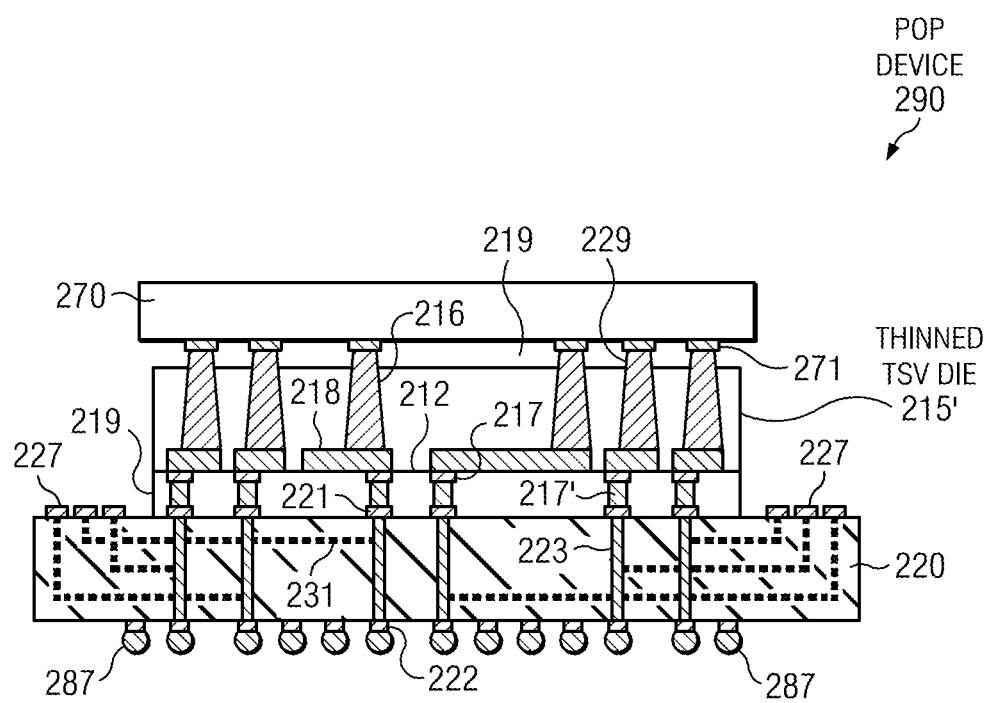
FIG. 2F is a cross sectional depiction of a singulated PoP device comprising a top IC die having pads bonded to TSV tips of the TSV die of the thinned electronic assembly shown in FIG. 2C, including lateral pads positioned on a topside surface of package substrate, according to a disclosed embodiment.

FIG. 2F is a cross sectional depiction of a singulated PoP device 290 comprising a top IC die having pads bonded to TSV tips 229 of the TSV die of the thinned electronic assembly shown in FIG. 2C, including lateral topside pads 227 positioned on a topside surface of package substrate, according to a disclosed embodiment. It is noted that the lateral topside pads 227 are coupled to both BGA pads 222 and the embedded topside substrate pads 221.

Figure 3:
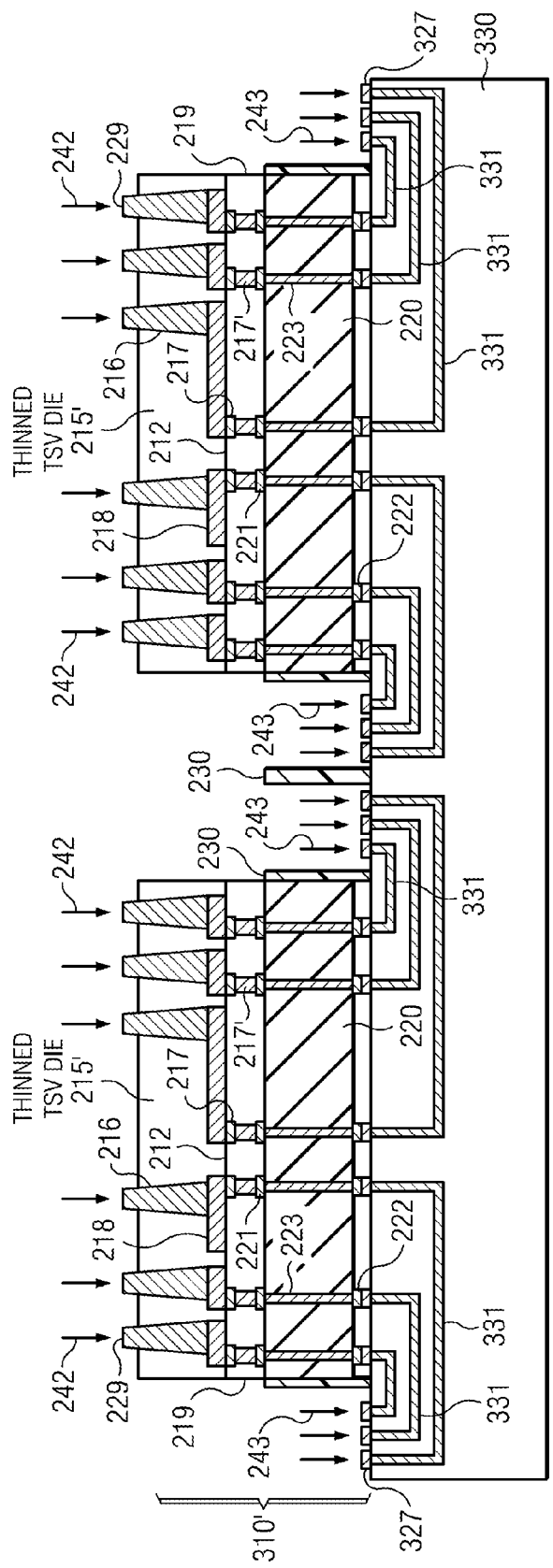
FIG. 3 is a cross sectional depiction of a thinned electronic assembly after exposure of lateral topside pads on a substrate carrier while being topside only dual-side tested, according to a disclosed embodiment.

FIG. 3 is a cross sectional depiction of a thinned electronic assembly 310' after exposure of lateral topside pads 327 on a multi-level metal embedded substrate carrier 330 while being topside only dual-side tested, according to a disclosed embodiment. In this embodiment, the die support is a die support stack comprising ML package substrate 220 secured to substrate carrier 330. The substrate carriers three (3) exemplary embedded metal levels shown provide lateral coupling paths 331. Previous assembly processing is not shown, but generally follows that described above regarding FIG. 2A (die attach) and FIG. 2B (TSV exposure). The distinction regarding this embodiment shown in FIG. 3 as compared to that shown in FIGS. 2A-2C is that substrate carrier 330 provides the lateral coupling paths 331 and the lateral topside pads 327 in the FIG. 3 embodiment. Thus the embedded topside substrate pads 221 are coupled to lateral topside pads 327 on the top surface of the substrate carrier 330 by routing through the package substrate 223 to lateral coupling paths 331 provided by the substrate carrier 330.

The active circuitry formed on the top semiconductor surface comprises circuit elements that generally include transistors, diodes, capacitors, and resistors, as well as signal lines and other electrical conductors that interconnect these various circuit elements.

Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A method of topside only dual-side testing of an electronic assembly comprising:
   providing said electronic assembly comprising a singulated through substrate via (TSV) die flip chip attached to a die support comprising a multilayer (ML) package substrate, wherein said TSV die has a die area and a plurality of TSVs that extend from its frontside to contactable TSV tips on its bottomside, wherein said TSVs on said frontside of said TSV die are coupled to embedded topside substrate pads on a top surface of said ML package substrate below said die area, and wherein said die support includes lateral coupling paths between at least a portion of said embedded topside substrate pads and lateral topside pads positioned on a topside surface of said die support lateral to said die area;
   contacting said contactable TSV tips with a first plurality of probes, interfaced to an automatic test system, to provide a first topside connection to said TSVs;
   contacting said lateral topside pads with a second plurality of probes, interfaced to the automatic test system, to provide a second topside connection,
   dual-side testing, by the automatic test system, across said electronic assembly using said first and said second topside connections; and
   obtaining, by the automatic test system, at least one test parameter.

2. The method of claim 1, wherein said electronic assembly comprises a plurality of said TSV die, and wherein said lateral topside pads include lateral topside substrate pads, and wherein a mold material is lateral to said die areas on said topside substrate, further comprising through mold via (TMV) processing to form at least one TMV lateral to said die areas by removing said mold material to reveal said lateral topside substrate pads.

3. The method of claim 1, wherein said die support comprises a die support stack and wherein said ML package substrate is secured to a substrate carrier.

4. The method of claim 2, wherein said ML package substrate comprises a plurality of embedded metal levels, and wherein said lateral coupling paths are lateral substrate coupling paths that utilize at least one of said embedded metal levels.

5. The method of claim 4, wherein at least some of said embedded topside substrate pads are not coupled by said lateral substrate coupling paths to said lateral topside pads.

6. The method of claim 1, wherein said die support comprises a die support stack comprising said ML package substrate secured to a substrate carrier, wherein said ML package substrate has a package substrate area;
   wherein said ML package substrate provides coupling between said embedded topside substrate pads and bottomside substrate pads on a bottom surface of said ML package substrate,
   wherein a mold material is lateral to said package substrate area on said topside substrate;
   wherein said substrate carrier comprises embedded carrier pads for coupling to said bottomside substrate pads and metal traces that provide said lateral coupling paths from said embedded carrier pads to lateral carrier pads which provide said lateral topside pads and are positioned on a topside surface of said carrier beyond said package substrate area,
   further comprising through mold via (TMV) processing to form at least one TMV lateral by removing said mold compound to reveal said lateral carrier pads.

7. The method of claim 6, wherein said substrate carrier comprises a dielectric.

8. The method of claim 6, wherein said substrate carrier comprises a multi-level metal embedded carrier.

9. The method of claim 1, wherein said ML package substrate comprises an organic substrate.

10. The method of claim 1, wherein said singulated TSV die comprises a plurality of said singulated TSV die, further comprising mold compound between adjacent ones of said plurality of said singulated TSV die, wherein said lateral topside pads comprise through mold vias (TMVs).

11. The method of claim 1, wherein said dual-side testing comprises utilizing a hybrid probe card, interfaced to the automatic test system, comprising a first plurality of vertical probes for contacting said contactable TSV tips and a second plurality of probes for contacting said lateral topside pads.

12. A carrier supported electronic assembly having structure for adding at least one top integrated circuit (IC) die thereon that is adapted for testing said electronic assembly before addition of said top IC die, comprising:
   a substrate carrier;
   a multilayer (ML) package substrate on said substrate carrier having embedded topside substrate pads that are coupled to bottomside substrate pads,
   wherein at least one of said substrate carrier and said ML package substrate include lateral coupling paths that couple at least a portion of said embedded topside substrate pads to lateral topside pads positioned on a topside surface of said ML substrate lateral to a die attach area or lateral to a package substrate area of said ML package substrate on a top surface of said substrate carrier, and
   at least one singulated through-substrate via (TSV) die flip chip attached to said ML package substrate in said die attach area, wherein said singulated TSV die includes a plurality of TSVs that extend from a back end of the line (BEOL) metal layer within a frontside of said singulated TSV die to a bottomside of said singulated TSV die that has contactable TSV tips, wherein said frontside of said TSVs are coupled to said embedded topside substrate pads.

13. The carrier supported electronic assembly of claim 12, wherein said ML package substrate comprises a plurality of embedded metal levels, and wherein said lateral coupling paths are lateral substrate coupling paths that utilize at least one of said embedded metal levels.

14. The carrier supported electronic assembly of claim 13, wherein at least some of said embedded topside substrate pads are not coupled by said lateral substrate coupling paths to said lateral topside pads.

15. The carrier supported electronic assembly of claim 12, wherein said substrate carrier comprises embedded carrier pads for coupling to said bottomside substrate pads and metal traces that provide said lateral coupling paths from said embedded carrier pads to lateral carrier pads which provide said lateral topside pads and are positioned on a topside surface of said carrier beyond said package substrate area.

16. The carrier supported electronic assembly of claim 12, wherein said substrate carrier comprises a dielectric.

17. The carrier supported electronic assembly of claim 12, wherein said substrate carrier comprises a multi-level metal embedded carrier.

18. A PoP device, comprising:
  at least one singulated through-substrate via (TSV) die having a die area,
  a multilayer (ML) package substrate having topside substrate pads which are within said die area and become embedded topside substrate pads after die attach that are coupled to bottomside substrate pads,
  wherein said TSV die is flip chip attached to said ML package substrate, and wherein said singulated TSV die includes a plurality of TSVs that extend from a back end of the line (BEOL) metal layer within a frontside of said singulated TSV die to contactable TSV tips on a bottomside of said TSV die, and wherein said frontside of said TSVs are coupled to said embedded topside substrate pads,
  wherein said ML package substrate includes a plurality of lateral coupling paths that are coupled to at least a portion of said embedded topside substrate pads and extend beyond said die area to (i) lateral coupling path ends along a sidewall of said ML package substrate or (ii) to lateral topside substrate pads on a topside of said package substrate beyond said die area, wherein said lateral topside substrate pads are coupled to both said bottomside substrate pads and said embedded topside substrate pads;
  and
  a top singulated IC die having pads bonded to said contactable TSV tips of said TSV die.

19. The PoP device of claim 18, wherein said top singulated IC die comprises a memory die and said singulated TSV die comprises a processor die.

20. The PoP device of claim 18, wherein said ML package substrate comprises an organic substrate.

21. The PoP device of claim 18, wherein said lateral coupling paths extend beyond said die area to said (i) lateral coupling path ends along said sidewall of said ML package substrate.

22. The PoP device of claim 18, wherein said lateral coupling paths extend beyond said die area to said (ii) to said lateral topside substrate pads on said topside of said package substrate beyond said die area.

23. The PoP device of claim 18, wherein said contactable TSV tips comprise protruding TSV tips.

* * * * *